(12) United States Patent
Roy

(10) Patent No.: US 6,175,500 B1
(45) Date of Patent: Jan. 16, 2001

(54) SURFACE MOUNT THERMAL CONNECTIONS

(75) Inventor: Apurba Roy, Rockwall, TX (US)

(73) Assignee: Lucent Technologies Inc., Murray Hill, NJ (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/158,671

(22) Filed: Sep. 22, 1998

(51) Int. Cl.⁷ .................................................. H05K 7/20
(52) U.S. Cl. ............................................ 361/719; 165/80.3
(58) Field of Search .............................. 228/179, 180.21, 228/180.22; 257/718, 719, 727; 174/16.3, 252, 255, 261; 165/80.3, 185; 29/832, 840; 361/704, 722, 717–720, 767, 768

(56) References Cited

U.S. PATENT DOCUMENTS 5,432,677 * 7/1995 Mowatt .
5,588,848 * 12/1996 Law .
5,842,275 * 12/1998 McMillan, II .
5,920,461 * 7/1999 Brune .
5,930,114 * 7/1999 Kuzmin .

FOREIGN PATENT DOCUMENTS 0 207 012   12/1986   (EP) .
0 449 435   10/1991   (EP) .
2 691 604   11/1993   (FR) .

* cited by examiner

Primary Examiner—Gerald Tolin
(74) Attorney, Agent, or Firm—Glen E. Books

(57) ABSTRACT

In accordance with the invention, a plurality of high thermal conductivity bodies are bonded to relatively hot spots of a component-populated substrate surface to provide thermal conduction from the surface to an overlying thermal plane. The high conductivity bodies can be configured for pick-and-place application and self-aligned in solder bonding. Receiving solder pads on the substrate facilitate low thermal resistance solder bonding and self-alignment. In a preferred embodiment the bodies are rectangular parallelpipeds with bifurcated bonding surfaces.

5 Claims, 2 Drawing Sheets

SURFACE MOUNT THERMAL CONNECTIONS

FILED OF THE INVENTION

This invention relates to devices for removing heat from substrates, such as printed wiring boards (PWBs) and, in particular, to an arrangement for removing heat from a component-populated substrate surface by the provision of pick-and-place thermal connectors between the surface and an overlying thermal plane.

BACKGROUND OF THE INVENTION

As electronic circuits become denser, faster and more complex, it is increasingly important to remove the heat generated by circuit components before the heat deteriorates component or circuit performance. Such heat removal is particularly difficult from a substrate surface populated by circuit components because the components are of varying height, varying heat generation, and varying thermal conductivity.

Conventional methods of removing heat from populated surfaces are less than satisfactory. One approach, commonly used with printed wiring boards, involves filling the space between the surface and an overlying thermal plane (metallic heat sink) with thermally conducting organic material. The material is commonly applied as a soft, conforming "thermal grease" and sometimes as a loaded sponge. Unfortunately organic materials are of limited assistance. Although better than air, the thermal conductivity of even well loaded organics is orders of magnitude less than highly conductive materials such as copper. Organic loading gives rise to fairly high thermal resistance in spite of high contact area.

A second approach is the use of contoured heat sinks or contoured intermediate plates. Aluminum or copper plates are specifically contoured to touch the PWB surface at critical areas. While this approach is thermally superior to organic loading, it is expensive and inflexible in that each different PWB design requires a redesigned contour. It is difficult to apply contoured plates by mechanized assembly. Accordingly there is a need for an improved connection arrangement for removing heat from component-populated substrate surfaces.

SUMMARY OF THE INVENTION

In accordance with the invention, a plurality of metal bodies are bonded to relatively hot spots of a component-populated substrate surface to provide thermal conduction from the surface to an overlying thermal plane. The metal bodies can be configured for pick-and-place application and self-alignment in solder bonding. Receiving solder pads on the substrate facilitate low thermal resistance solder bonding and self-alignment. In a preferred embodiment the bodies are rectangular parallelpipeds with bifurcated bonding surfaces.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and are not to scale.

DETAILED DESCRIPTION

Figure 1:
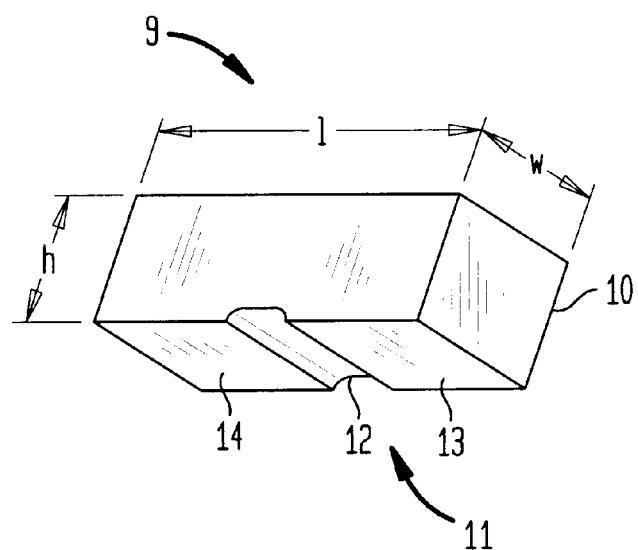
FIG. 1 is a perspective view of a high conductivity, surface mount thermal connector.

Referring to the drawings, FIG. 1 is a perspective view of a high conductivity surface-mount thermal connector 9 comprising a solid metallic body 10 having a height h which is greater than the height of any component on the region of the substrate to be cooled and a bonding surface 11. Advantageously, the bonding surface 11 is bifurcated by a recessed region 12 into two bonding portions 13, 14 to facilitate self-alignment on appropriately configured substrate bonding pads. In the preferred embodiment shown, the body is a rectangular parallelpiped. The body is made of high thermal conductivity material such as copper.

Figure 2:
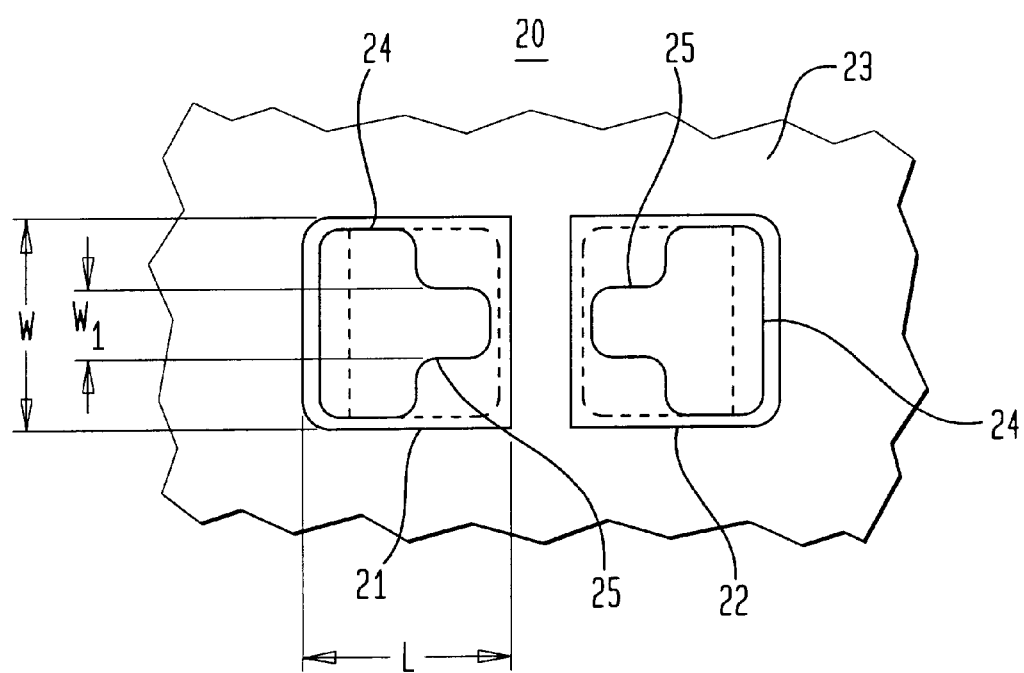
FIG. 2 is a top view of a substrate bonding pad for receiving the connector of FIG. 1.

FIG. 2 is a top view of a substrate bonding pad configured for receiving the surface mount thermal connector of FIG. 1. Preferably the pad 20 on substrate 23 is a bifurcated bonding pad comprising two plated metal regions 21 and 22. The plated metal regions 21, 22 approximate the configuration and size of bonding portions 13, 14 of the connector. Each plated metal region includes a pattern of solder 24 including a region 25 of reduced width intermediate the ends of the connector.

The dashed line illustrates how bonding portions of the connector 9 are to be placed on the pad. The advantages of this combination of connector and pad are that the connector is self-aligning during solder reflow and the amount of solder (a thermally resistive material compared to copper) between the pad 20 and the connector 9 is minimal.

In application, it is contemplated that the designer laying out the substrate 23 will determine a plurality of areas of the substrate most subject to heat accumulation—areas near heat generating components such as high current FETs, power diodes and high transistor count ICs (e.g. microprocessors)—and include pads 20 in such locations in the board layout. In assembly, a corresponding plurality of connectors 9 are applied to these pads by pick-and-place assembly and then solder bonded to the substrate.

Figure 3:
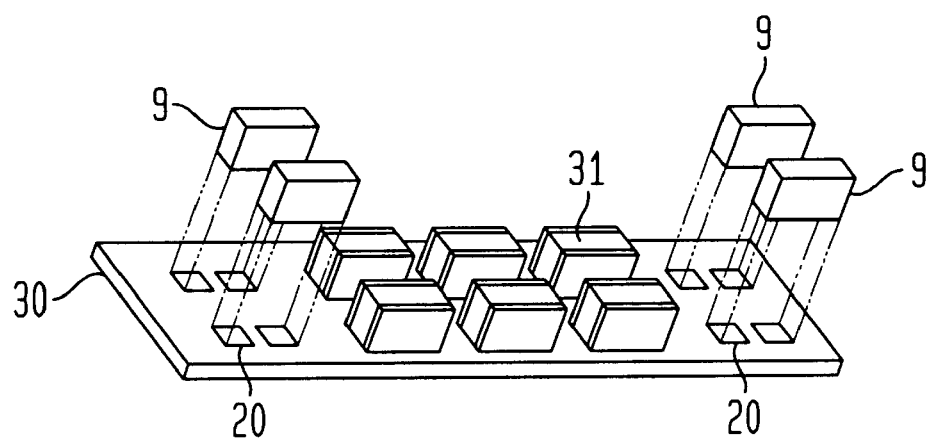
FIG. 3 is a perspective view showing how the surface mount thermal connectors are disposed on a component-populated substrate surface.

FIG. 3 is a perspective view showing a plurality of surface mount thermal connectors 9 mounted on a component-populated surface of a substrate or circuit board 30. The substrate surface contains one or more circuit components or electronic devices 31 and is provided with a plurality of bonding pads 20 for receiving the connectors. Advantageously the pads (as shown in FIG. 2) are pre-coated with solder. The height of the connectors 9 is greater than the height of the circuit components or devices 31. The connectors can be advantageously placed on the pads by standard pick-and-place techniques and can be soldered on the pads in a conventional solder reflow step.

Figure 4:
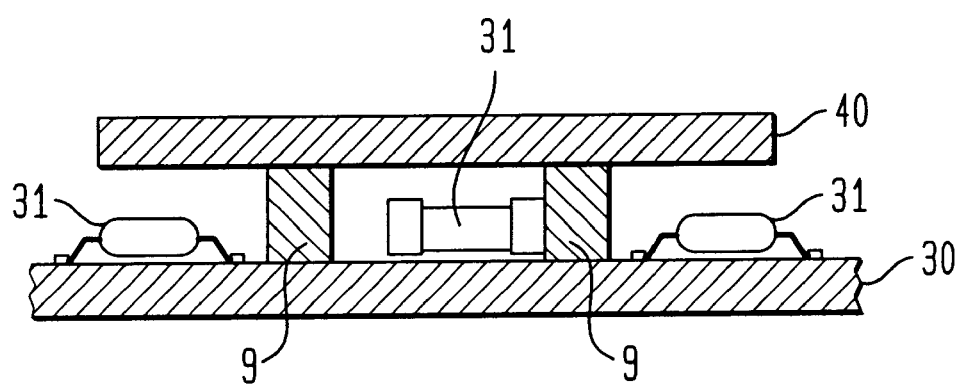
FIG. 4 is a schematic side view showing how a thermal plane is disposed on to the mounted connectors.

The final step in providing for heat removed is to apply a thermal plane—typically a copper or aluminum plate—in thermal contact with the connectors 9. FIG. 4 schematically illustrates a finished device wherein the connectors 9 extend above the circuit components 31 to a thermal plane 40.

As a specific example, the connectors 9 can be rectangular parallelpipeds having a length I=132 mils, a height h=68 mils and a width w=68 mils. The gold plating can be several microinches to facilitate solder bonding. The recessed region 12 bisects a 68×132 bonding surface. It has a depth of 6 mils and extends 30 mils in the length dimension.

The corresponding bonding pad 20 comprises a pair of L=82 mils×W=80 mils portions separated by 20 mils between the two 82 mil regions. The solder pattern 24 can have a width of 74 mils reduced to $w_1$=37 mils.

It is to be understood that these above-described embodiments are illustrative of only some of the many possible specific embodiments which can represent applications of the principles of the invention. For example, while the connector is illustrated as a rectangular parallelpiped, other body forms such as cylinders can also be used. Thus numerous and varied other arrangements can be made by those skilled in the art without departing from the spirit and scope of the invention.

What is claimed:

1. Apparatus for removing heat from a substrate supporting heat generating components comprising:

substrate having a surface populated by heat generating components, the surface having positions thereon subject to greatest heat accumulation;

a plurality of solder bonding pads on said surface located at a plurality of said positions;

a plurality of solid metal bodies without internal cavities, each body having a height greater than the height of said components, a length dimension greater than the height and having a bonding surface including the length dimension bonded to said bonding pads; and a thermal plane overlying the substrate surface and in thermal contact with said bodies, whereby said bodies remove heat from said substrate surface by conducting it to said thermal plane.

2. Apparatus according to claim 1 wherein the bonding surfaces of said bodies are bifurcated by recessed regions.

3. Apparatus according to claim 1 wherein said substrate is an electrically insulating substrate and said heat-generating components are electrical or electronic circuit components.

4. Apparatus according to claim 1 wherein said bodies comprise copper.

5. Apparatus according to claim 1 wherein said bodies are rectangular parallelpipeds.

* * * * *